(12) United States Patent
Ma et al.

(10) Patent No.: US 6,687,266 B1
(45) Date of Patent: Feb. 3, 2004

(54) ORGANIC LIGHT EMITTING MATERIALS AND DEVICES

(75) Inventors: Bin Ma, Monroeville, PA (US); David B. Knowles, Apollo, PA (US); Cory S. Brown, Monroeville, PA (US); Drew Murphy, Lakewood, CA (US); Mark E. Thompson, Anaheim, CA (US)

(73) Assignees: Universal Display Corporation, Ewing, NJ (US); The University of Southern California, Los Angeles, CA (US)

( * ) Notice: Subject to any disclaimer, the term of this patent is extended or adjusted under 35 U.S.C. 154(b) by 0 days.

(21) Appl. No.: 10/291,338

(22) Filed: Nov. 8, 2002

(51) Int. Cl.$^7$ ................................. H01S 3/30
(52) U.S. Cl. .................. 372/7; 372/39; 257/141
(58) Field of Search .............. 372/7, 39; 428/690, 428/432; 257/141; 438/144, 745; 427/66, 64; 430/200; 313/504, 506

(56) References Cited

U.S. PATENT DOCUMENTS

| | | | | |
|---|---|---|---|---|
| 4,769,292 A | * | 9/1988 | Tang et al. | 428/690 |
| 5,247,190 A | | 9/1993 | Friend et al. | |
| 5,703,436 A | | 12/1997 | Forrest et al. | |
| 5,707,745 A | * | 1/1998 | Forrest et al. | 428/432 |
| 5,834,893 A | * | 11/1998 | Bulovic et al. | 313/506 |
| 5,844,363 A | | 12/1998 | Gu et al. | |
| 6,013,982 A | | 1/2000 | Thompson et al. | |
| 6,087,196 A | | 7/2000 | Sturm et al. | |
| 6,091,195 A | | 7/2000 | Forrest et al. | |
| 6,097,147 A | * | 8/2000 | Baldo et al. | 313/506 |
| 6,294,398 B1 | | 9/2001 | Kim et al. | |
| 6,303,238 B1 | * | 10/2001 | Thompson et al. | 428/690 |
| 6,337,102 B1 | * | 1/2002 | Forrest et al. | 427/64 |
| 6,468,819 B1 | | 10/2002 | Kim et al. | |

FOREIGN PATENT DOCUMENTS

| | | |
|---|---|---|
| EP | 0 700 917 | 3/1996 |
| WO | 02/15645 | 2/2002 |

OTHER PUBLICATIONS

M. A. Baldo et al., "Highly efficient phosphorescent emission from organic electroluminescent deives," *Nature,* vol. 395, pp. 151–154. (1998).

M.A. Baldo et al., "Very high–efficiency green organic ligh–emitting devices based on electrophosphorescence", *Applied Physics Letters,* vol. 75, No. 1, pp. 4–6 (1999).

(List continued on next page.)

*Primary Examiner*—Leon Scott, Jr.
(74) *Attorney, Agent, or Firm*—Kenyon & Kenyon

(57) ABSTRACT

An organic light emitting device is provided. The device includes an anode, a cathode, and an emissive layer disposed between the anode and the cathode. The emissive layer includes material having the structure:

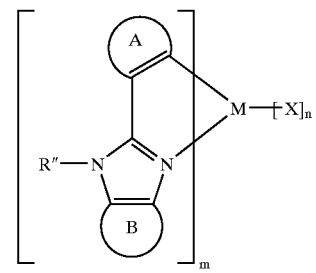

M is a metal having an atomic weight greater than 40, m is at least 1, n is at least zero, R" is H or any substituent, X is an ancillary ligand, and A is selected from the group consisting of aryl and heteroaryl rings, and B is an aryl ring. A material including the photoactive ligand of the above material is also provided.

35 Claims, 4 Drawing Sheets

OTHER PUBLICATIONS

C. Adachi et al., "Nearly 100% Internal Phosphorescence Efficiency in an Organic Light Emitting Device", *J. Appl. Phys.*, vol. 90, No. 10, pp. 5048–5051 (2001).

H. J. A. Dartnall et al., "Human Visual Pigments: Microspectrophotometric Results from the Eyes ofSeven Persons," *Proc. R. Soc. Lond. B*, vol. 220, pp. 115–130 (1983).

U. S. patent application Ser. No. 10/173,682 to Forrest et al.

U.S. patent application Ser. No. 09/931,948 to Lu et al.

U.S. patent application Ser. No. 10/233,470 to Shtein et al.

M.P. Singh et al., "Synthetic Utility of Catalytic Fe(III)/Fe(II) Redox Cycling Towards Fused Hetercycles: A Facile Access to Substituted Benzimidazole, Bis–benzimidazole and Imidazopyridine Derivatives," *Synthesis 2000*, No. 10, pp. 1380–1390.

Igarashi et al., U.S. patent application Publication No. 2001/0019782, published Sep. 6, 2001.

S. Lamansky et al., "Synthesis and Characterization of Phosphorescent Cyclometalated Iridium Complexes," *Inorganic Chemistry*, vol. 40, No. 7, pp. 1740–1711 (2001).

R. C. Kwong et al., "High Operational Stability of Electrophosphorescent Devices," *Applied Physics Letters*, vol. 81 No. 1, pp. 162–164 (2002).

S. Lamansky et al., "Highly Phosphorescent Bis–Cyclometalated Iridium Complexes: Synthesis, Photophysical Characterization, and Use in Organic Light Emitting Diodes," *J. Am. Chem. Soc.*, vol. 123, No. 18, pp. 4304–4312 (2001).

\* cited by examiner

ORGANIC LIGHT EMITTING MATERIALS AND DEVICES

FIELD OF THE INVENTION

The present invention relates to organic light emitting devices (OLEDs), and more specifically to organic materials used in such devices.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be an fluorescent or phosphorescent small molecule emitter.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic opto-electronic devices. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

One application for phosphorescent emissive materials is a full color display. Industry standards for such a display call for pixels adapted to emit particular colors, referred to as "saturated" colors. In particular, these standards call for saturated red, green, and blue pixels. Color may be measured using CIE coordinates, which are well known to the art. CIE coordinates are described in H. Zollinger, "Color Chemistry" VCH Publishers, 1991 and H, J, A, Dartnall, J. K. Bowmaker, and J. D. Mollon, Proc. Roy. Soc. B (London), 1983, 220, 115–130, which are incorporated by reference.

Another application for phosphorescent emissive materials is a display, full color or otherwise, that is intended to be powered by battery, such as the display of a cellular telephone or a digital camera. For such applications, power efficiency is a particularly important parameter, because efficient emission may significantly extend battery life, and/or enable the use of smaller batteries. Lighting is another application where efficiency is of particular importance, because of the sheer volume of power used for lighting applications. Efficiency is also important for many other applications. Moreover, a high efficiency may lead to a longer lifetime, because inefficient devices generally lose power to heat instead of emitting light, and heat may adversely affect device lifetime.

SUMMARY OF THE INVENTION

An organic light emitting device is provided. The device includes an anode, a cathode, and an emissive layer disposed between the anode and the cathode. The emissive layer includes a material having the structure:

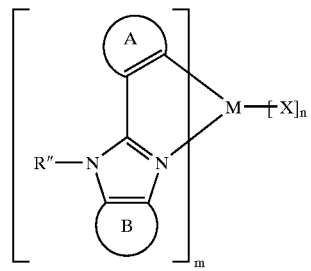

M is a metal having an atomic weight greater than 40, m is at least 1, n is at least zero, R" is H or any substituent, X is an ancillary ligand, and A is selected from the group consisting of aryl and heteroaryl rings, and B is an aryl ring.

A material including the photoactive ligand of the above material is also provided.

DETAILED DESCRIPTION

Figure 1:
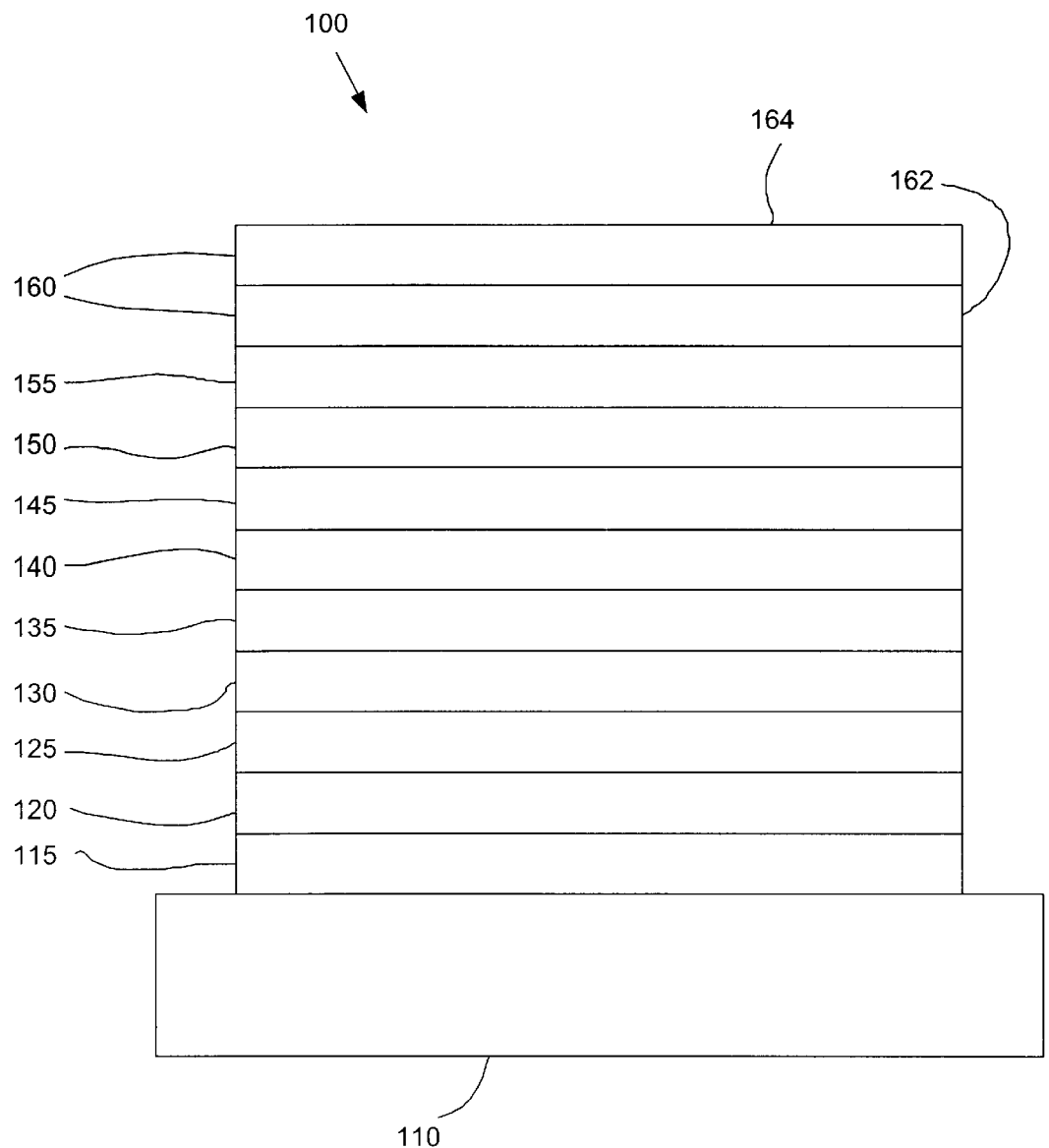
FIG. 1 shows an organic light emitting device having separate electron transport, hole transport, and emissive layers, as well as other layers.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices", Nature, vol. 395, 151–154, 1998; ("Baldo-I") and Baldo et al., "Very high-efficiency green organic light-emitting devices based on electrophosphorescence", Appl. Phys. Lett., vol. 75, No. 3, 4–6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that a material that exhibits phosphorescence at liquid nitrogen temperatures may not exhibit phosphorescence at room temperature. But, as demonstrated by Baldo, this problem may be addressed by selecting phosphorescent compounds that do phosphoresce at room temperature.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. No. 5,844,363, which is incorporated by reference in its entirety. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in U.S. patent application Ser. No. 10/173,682 to Forrest et al., which is incorporated by reference in its entirety. Other hole transport layers may be used.

Emissive layer 135 may include an organic material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 may also comprise a host material capable of transporting electrons and/or holes, doped with an emissive material that may trap electrons, holes, and/or excitons, such that excitons relax from the emissive material via a photoemissive mechanism. Emissive layer 135 may comprise a single material that combines transport and emissive properties. Whether the emissive material is a dopant or a major constituent, emissive layer 135 may comprise other materials, such as dopants that tune the emission of the emissive material. Emissive layer 135 may include a plurality of emissive materials capable of, in combination, emitting a desired spectrum of light. Examples of phosphorescent emissive materials include $Ir(ppy)_3$. Examples of fluorescent emissive materials include DCM and DMQA. Examples of host materials include $Alq_3$, CBP and mCP. Examples of emissive and host materials are disclosed in U.S. Pat. No. 6,303,238 to Thompson et al., which is incorporated by reference in its entirety. Emissive material may be included in emissive layer 135 in a number of ways. For example, an emissive small molecule may be incorporated into a polymer or dendrimer molecule. Other emissive layer materials and structures may be used.

Electron transport layer 140 may include a material capable of transporting electrons. Electron transport layer 140 may be intrinsic (undoped), or doped. Doping may be used to enhance conductivity. $Alq_3$ is an example of an intrinsic electron transport layer. An example of an n-doped electron transport layer is BPhen doped with Li at a molar ratio of 1:1, as disclosed in U.S. patent application Ser. No. 10/173,682 to Forrest et al., which is incorporated by reference in its entirety. Other electron transport layers may be used.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron transport layer 145, to block holes from leaving emissive layer 135 in the direction of electron transport layer 140. Blocking layers may also be used to block excitons from diffusing out of the emissive layer. The theory and use of blocking layers is described in more detail in U.S. Pat. No. 6,097,147 and U.S. patent application Ser. No. 10/173,682 to Forrest et al., which are incorporated by reference in their entireties.

Generally, injection layers are comprised of a material that may improve the injection of charge carriers from one layer, such as an electrode or an organic layer, into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. patent application Ser. No. 09/931,948 to Lu et al., which is incorporated by reference in its entirety.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped with Li. A more detailed description of protective layers may be found in U.S. patent application Ser. No. 09/931,948 to Lu et al., which is incorporated by reference in its entirety.

Figure 2:
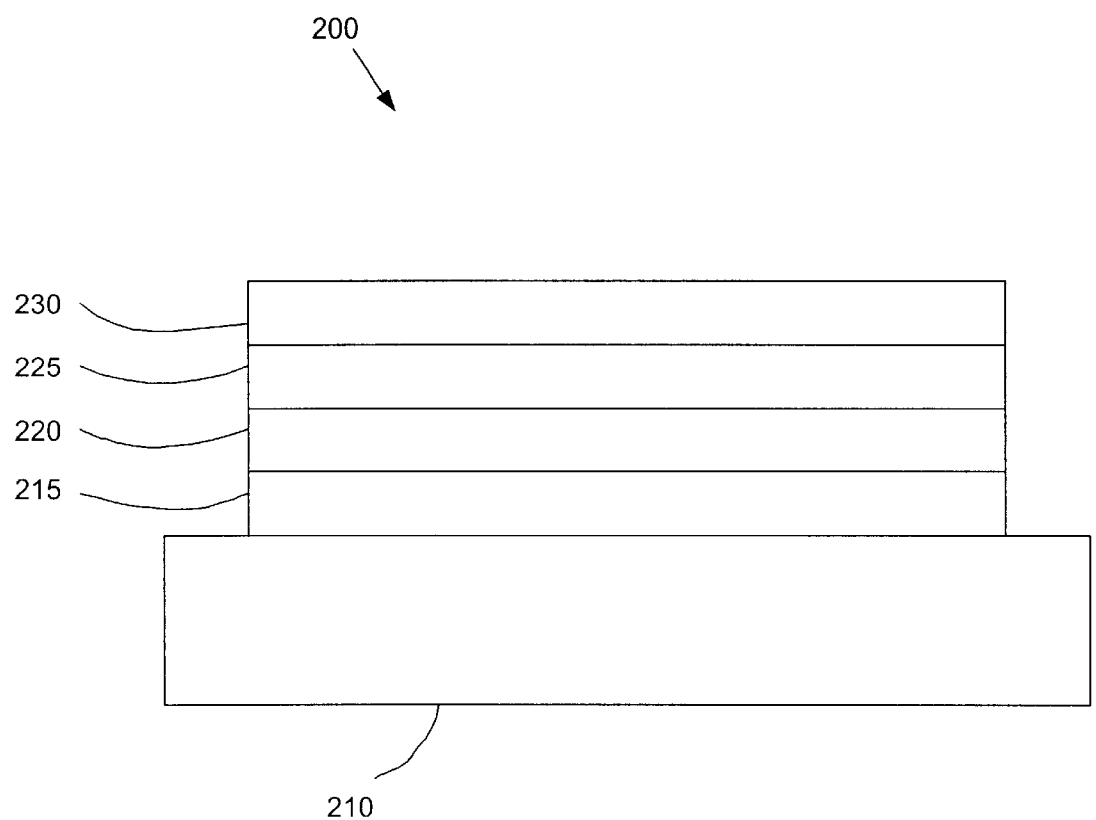
FIG. 2 shows an inverted organic light emitting device that does not have a separate electron transport layer.

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and organic vapor jet deposition (OVJD), such as described in U.S. patent application Ser. No. 10/233,470, which is incorporated by reference in its entirety. Other suitable deposition methods include spin coating and other solution based processes. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C to 30 degrees C, and more preferably at room temperature (20–25 degrees C).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

Industry standards for full color displays call for a saturated red, green and blue emissive materials. It is desirable to have a material that may be "tuned" over a broad range of color coordinates, such that particular colors, for example highly saturated colors, may be obtained.

Phosphorescent light emitting materials are of interest due, in part, to the high efficiencies that may be achieved with such materials. An example of such a material is Ir(ppy)$_3$:

Formula 1:

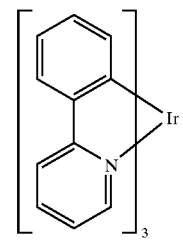

In an embodiment of the invention, a highly tunable phosphorescent light emitting material is provided. The material may include a ligand having the following structure:

Formula 2:

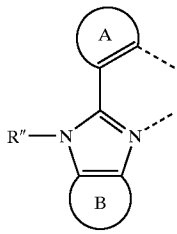

In formula 2, rings A and B may be any aryl or heteroaryl ring. Preferably, ring B is an aryl ring, because a heteroaryl B ring may be difficult to synthesize. Preferably, rings A and B are 5 or 6-membered aryl ring systems. Aryl rings are also preferred over heteroaryl rings because it is believed that device stability is better when A and B are aryl rings. Rings A and B may incorporate a single or multiple heteroatoms. Nitrogen is an example of a suitable heteroatom. Rings A and B may be benzannulated and may contain substitutents. H or any substituent may be used on rings A and B, as well as R". Preferred substituents include alkyl, alkoxy, amino, halogen, carboxy, aryl, heteroaryl, alkenyl, and alkynl. Rings A and B may be selected from the same ring system, or may be different. Rings A and B may include the same or different substituents. R" may be H or any substituent. As used herein, the term "substituent" means any atom or group of atoms that may be substituted for hydrogen.

The ligand of formula 2 may be attached to a metal M having an atomic weight greater than 40. Preferred metals include Ir, Pt, Pd, Rh, Re, Ru, Os, Tl, Pb, Bi, In, Sn, Sb, Te, Au, and Ag. More preferably, the metal is Pt. Most preferably, the metal is Ir. Multiple ligands may be attached to the metal. In one embodiment, ligands are attached to the metal M as follows:

Formula 3:

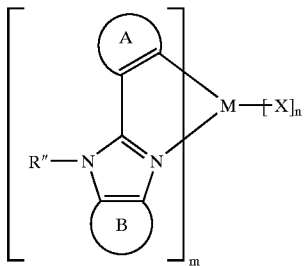

Rings A and B, as well as R", are as described with respect to formula 2.

"X" may be referred to as an "ancillary ligand." Preferred ligands include any mono-anionic ligand. X may coordinate to the metal in a single or multiple locations. For example, X may be a bidentate ligand. The X ligand is referred to as "ancillary" because it is believed that it may modify the photoactive properties of the material, as opposed to directly contributing to the photoactive properties. By way of contrast, the ligand to the left is referred to as "photoactive" because it is believed that it contributes to the photoactive properties of the material. The definitions of photoactive and ancillary are intended as non-limiting theories.

"m" is the number of photoactive ligands of a particular type, and "n" is the number of ancillary ligands of a particular type. Depending upon the metal M, a certain number of ligands may be attached to the metal. Generally, the ligands are bidentate, which means that they form two bonds with the metal, but bidentate ligands are not required. For example, two chlorines could be attached to the metal in place of a bidentate ancillary ligand. "m" is at least one, and may be any integer greater than zero up to the maximum number of ligands that may be attached to the metal. "n" may be zero, and may be an integer greater than zero, subject to the requirement that "m" is at least one. "m"+"n" may be less than the total number of ligands that may be attached to M, such that ligands other than those specifically illustrated in Formula 2 may also be attached to M. These additional ligands may be photoactive or ancillary. For iridium, to which 3 bidentate ligands may be attached, "m" may be 1, 2 or 3, and "n" may be 0, 1 or 2.

Preferred ancillary ligands include acetylacetonate (acac), picolinate (pic) and dipivaloylmetanate (t-butyl acac). Some preferred ancillary ligands have the following structure according to Formula 4 (pic), Formula 5 (acac), and Formula 6 (t-butyl acac). Other ancillary ligands may be used. Further non-limiting examples of ancillary ligands may be found in PCT Application Publication WO 02/15645 A1 to Lamansky et al. at pages 89–90, which are incorporated herein by reference:

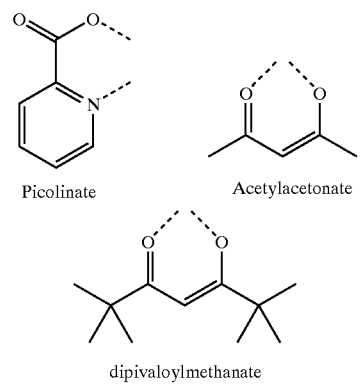

Picolinate        Acetylacetonate dipivaloylmethanate

In a preferred embodiment, n is zero, and m is the maximum number of ligands that may be attached to the metal. For example, for Ir, m is three in this preferred embodiment, and the structure may be referred to as a "tris" structure. The tris structure is preferred because it is believed to be particularly stable. The stability of the tris structure, combined with the stability and color tuning provided by the $R_3$ group, may result in a particularly stable blue emitting phosphorescent material.

In one embodiment, m+n is equal to the total number of bidentate ligands that may be attached to the metal in question—for example, 3 for Ir. In another embodiment, m+n may be less than the maximum number of bidentate ligands that may be attached to the metal, in which case other ligands—ancillary, photoactive, or otherwise—may also be attached to the metal. Preferably, if there are different photoactive ligands attached to the metal, each photoactive ligand has the structure indicated in Formula 2.

In one embodiment, the material of Formula 3 has the structure of Formula 7:

Formula 7:

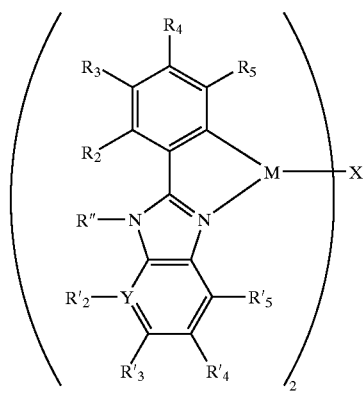

Y may be selected from the group consisting of C and N. Preferably, Y is C, because it is believed that using compounds in accordance with Formula 3 lead to more stable devices when the top and bottom rings are aryl rings as opposed to heteroaryl rings. R2, R3, R4, R5, R'2, R'3, R'4, R'5, and R" may each independently selected from the group consisting of H and any substituent. Where there are multiple substituents, R", R2, R3, R4, R5, R'2, R'3, R'4 and R'5 may be linked to another of the groups R", R2, R3, R4, R5, R'2, R'3, R'4 and R'5 to form a ring.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

Material Definitions

As used herein, abbreviations refer to materials as follows:

| | |
|---|---|
| CBP: | 4,4'-N,N'-dicarbazole-biphenyl |
| m-MTDATA: | 4,4',4"-tris(3-methylphenylphenly-amino)triphenylamine |
| Alq$_3$: | 8-tris-hydroxyquinoline aluminum |
| Bphen: | 4,7-diphenyl-1,10-phenanthroline |
| n-BPhen: | n-doped BPhen (doped with lithium) |
| F$_4$-TCNQ: | tetrafluoro-tetracyano-quinodimethane |
| p-MTDATA: | p-doped m-MTDATA (doped with F$_4$-TCNQ) |

-continued

| | |
|---|---|
| Ir(ppy)$_3$: | tris(2-phenylpyridine)-iridium |
| Ir(ppz)$_3$: | tris(1-phenylpyrazoloto,N,C(2')iridium(III) |
| BCP: | 2,9-dimethyl-4,7-diphenyl-1,10-phenanthroline |
| TAZ: | 3-phenyl-4-(1'-naphthyl)-5-phenyl-1,2,4-triazole |
| CuPc: | copper phthalocyanine. |
| ITO: | indium tin oxide |
| NPD: | naphthyl-phenyl-diamine |
| TPD: | N,N'-bis(3-methylphenyl)-N,N'-bis-(phenyl)-benzidine |
| BAlq: | aluminum(III)bis(2-methyl-8-quinolinato)4-phenylphenolate |
| mCP: | 1,3-dicarbazole-benzene |
| DCM: | 4-(dicyanomethylene)-6-(4-dimethylaminostyryl-2-methyl)-4H-pyran |
| DMQA: | N,N'-dimethylquinacridone |

Experimental

Specific representative embodiments of the invention will now be described, including how such embodiments may be made. It is understood that the specific methods, materials, conditions, process parameters, apparatus and the like do not necessarily limit the scope of the invention.

In general, synthesis of the benzimidazole ligands can be prepared as shown in the following two steps depicted in Reaction A and B. Substituted or unsubstituted aromatic diamines can be found commercially or synthesized via Reaction A. In reaction A, the substituted or unsubstituted 2-chloronitrobenzenes represented by graphic formula I, reacts neat with a substituted aniline and a base such as NaHCO$_3$ by refluxing under nitrogen atmosphere to give compounds represented by graphic formula II. The product after purification can be reduced to the corresponding aromatic diamines by using any number of reducing agents i.e. hydrazine and the addition of FeCl$_3$.6H$_2$O to give III Reaction Scheme A

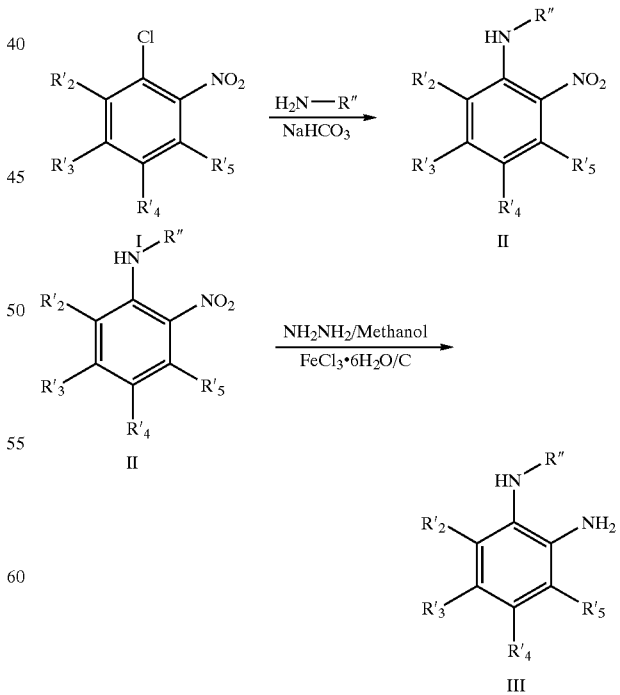

The synthesis of substituted or unsubstituted benzimidazole ligands can be prepared using diamines represented by graphic formula III as described in Reaction B. Diamines III can then be reacted with a substituted or unsubstituted benzaldehyde as depicted in Reaction Scheme B as described in *Synthesis*2000, 10, 1380–90 to give the substituted benzimidazole ligands represented by graphic formula IV.

Reaction Scheme B

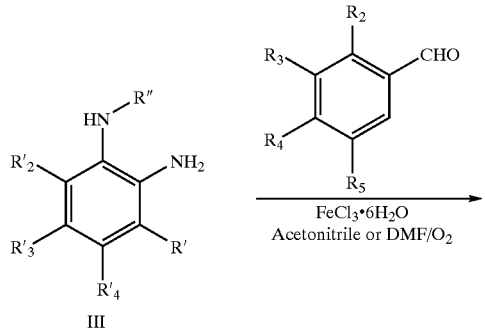

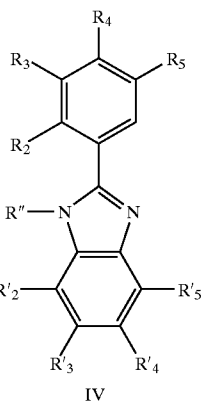

IV

In Reaction C, the benzimidazole ligands prepared from Reaction B and represented by graphic formula IV, can be reacted with a variety of metals, e.g., iridium, platinum, in the presence of a solvent, e,g, 2-methoxyethanol or 2-ethoxyethanol and water under refluxing conditions to produce the dichloro-bridge dimer represented by graphic formula V. A solid precipitate that is formed upon completion of the reaction is collected by vacuum filtration techniques and further purified if necessary.

Reaction C

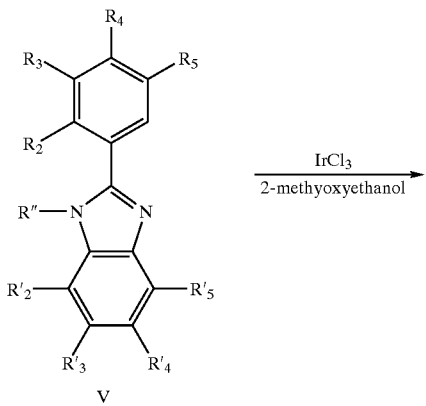

V

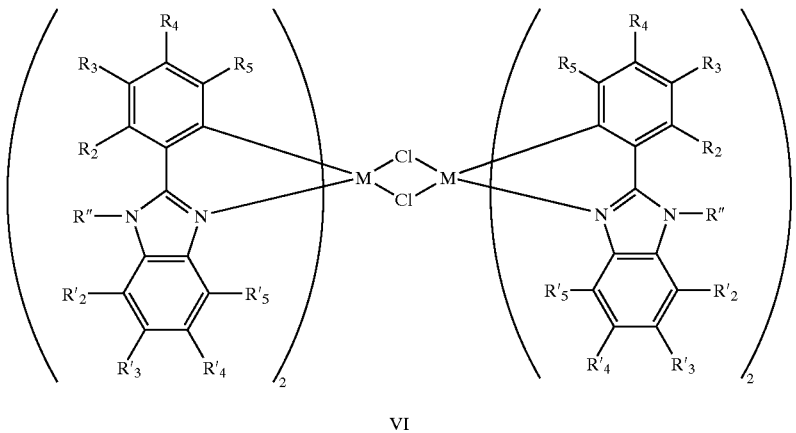

VI

In Reaction D the dichlorobridge dimers represented by graphic formula VI can be reacted with a variety of mono-anionic coordinating ligands, e.g. acetonacetyl (acac), picolinic acid, 4-dimethylaminopicolinic acid (DMAPic) and mono-anionic metal-carbon coordination ligands e.g., substituted 2-phenylpyridines, etc and is denoted by X. The final isolated products represented by graphic VII are purified by standard techniques.

Reaction D

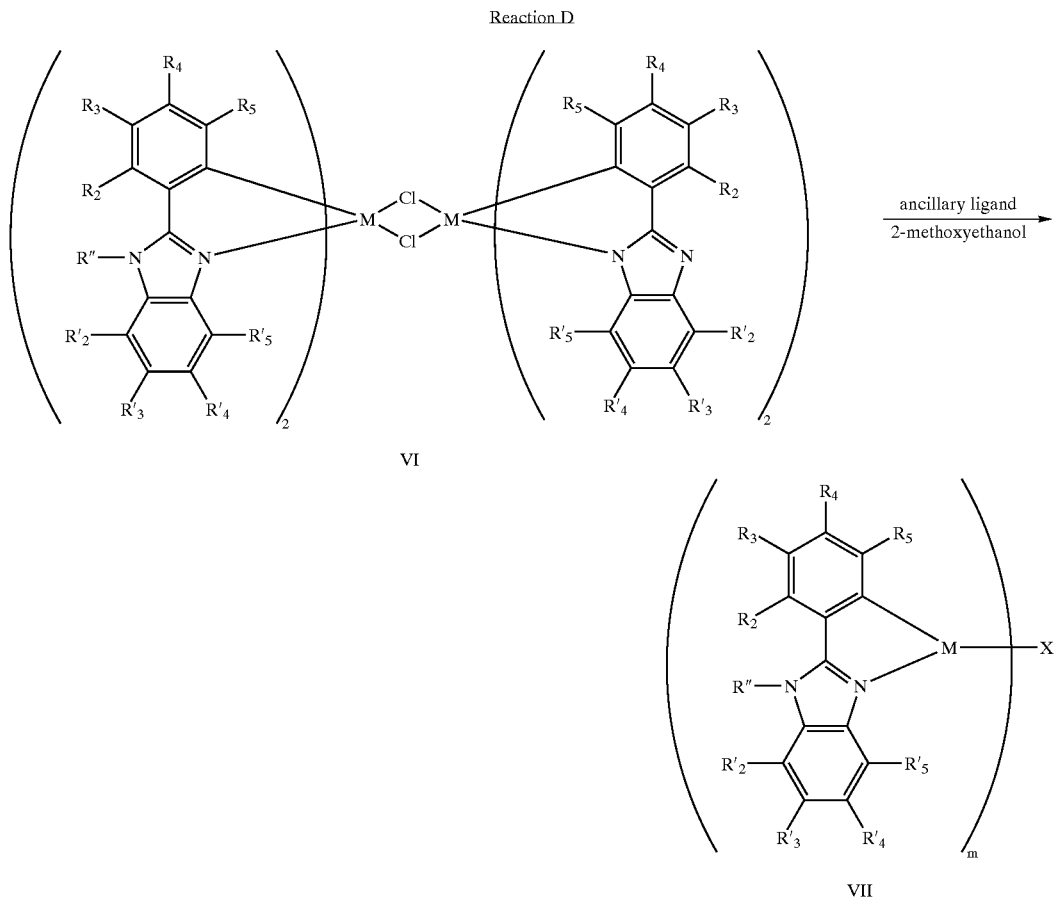

The materials listed in Table 1 were fabricated according to Formula 7 using the synthetic routes described above or similar routes:

TABLE 1

| Cmp | M | $R_2$ | $R_3$ | $R_4$ | $R_5$ | R" | Y | $R'_2$ | $R'_4$ | X | C.I.E (MeCl$_2$) | PL (nm) |
|---|---|---|---|---|---|---|---|---|---|---|---|---|
| 1 | Ir | H | H | H | H | CH$_3$ | C | H | H | acac | 0.32, 0.60 | 509 |
| 2 | Ir | F | H | F | H | CH$_3$ | C | H | H | pic | 0.25, 0.48 | 476 |
| 3 | Ir | H | H | OCH$_3$ | H | CH$_3$ | C | H | H | acac | 0.23, 0.53 | 488 |
| 4 | Ir | H | H | CF$_3$ | H | CH$_3$ | C | H | H | pic | 0.34, 0.59 | 510 |
| 5 | Ir | H | CF$_3$ | H | H | H | C | H | H | pic | 0.28, 0.55 | 490 |
| 6 | Ir | H | H | H | H | C$_6$H$_5$ | C | H | CF$_3$ | acac | 0.37, 0.60 | 522 |
| 7 | Ir | H | H | OCH$_3$ | H | CH$_3$ | C | H | H | tris | 0.25, 0.54 | 488 |
| 8 | Ir | H | H | N(CH$_3$)2 | H | C$_6$H$_5$ | C | H | H | acac | 0.35, 0.60 | 519 |
| 9 | Ir | H | H | CF$_3$ | H | C$_6$H$_5$ | N | H | H | acac | 0.54, 0.45 | 584 |
| 10 | Ir | H | H | H | H | pOCH$_3$Ph | C | H | H | acac | 0.36, 0.60 | 515 |
| 11 | Ir | Cl | Cl | H | Cl | C$_6$H$_{10}$ | C | H | OCH$_3$ | acac | 0.50, 0.49 | 580 |
| 12 | Ir | OCH$_3$ | H | OCH$_3$ | H | CH$_3$ | C | H | H | acac | 0.33, 0.53 | 494 |
| 13 | Ir | F | F | F | H | CH$_3$ | C | H | H | acac | 0.28, 0.55 | 490 |
| 14 | Ir | F | F | F | H | CH$_3$ | C | H | H | pic | 0.28, 0.55 | 488 |
| 15 | Ir | Cl | Cl | H | Cl | CH$_3$ | C | H | H | acac | 0.26, 0.47 | 470 |
| 16 | Ir | H | CF$_3$ | F | H | CH$_3$ | C | H | H | acac | 0.27, 0.53 | 485 |
| 17 | Ir | H | CF$_3$ | F | H | CH$_3$ | C | H | H | pic | 0.24, 0.46 | 474 |
| 18 | Ir | H | F | OCH$_3$ | H | CH$_3$ | C | H | H | acac | 0.29, 0.52 | 488 |
| 19 | Ir | H | Dioxolene ring | H | CH$_3$ | C | H | H | acac | 0.35, 0.54 | 522 |

TABLE 1-continued

| Cmp | M | R$_2$ | R$_3$ | R$_4$ | R$_5$ | R" | Y | R'$_2$ | R'$_4$ | X | C.I.E (MeCl$_2$) | PL (nm) |
|---|---|---|---|---|---|---|---|---|---|---|---|---|
| 20 | Ir | H | CF$_3$ | H | CF$_3$ | CH$_3$ | C | H | H | acac | 0.30, 0.56 | 490 |
| 21 | Ir | H | CF$_3$ | H | CF$_3$ | CH$_3$ | C | H | H | pic | 0.30, 0.56 | 488 |
| 22 | Ir | H | H | OCF$_3$ | H | CH$_3$ | C | H | H | acac | 0.32, 0.58 | 500 |
| 23 | Ir | H | H | OCF$_3$ | H | CH$_3$ | C | H | H | pic | 0.27, 0.54 | 486 |
| 24 | Ir | CF$_3$ | H | CF$_3$ | H | CH$_3$ | C | H | H | acac | 0.55, 0.45 | 580 |
| 25 | Ir | F | F | F | F | CH$_3$ | C | H | H | acac | 0.32, 0.58 | 496 |
| 26 | Pt | H | H | H | H | CH$_3$ | C | H | H | acac | 0.31, 0.56 | 486 |
| 27 | Pt | F | H | F | H | CH$_3$ | C | H | H | acac | 0.28, 0.52 | 479 |
| 28 | Ir | H | H | H | H | CH$_2$CH$_2$-R' | C | CH$_2$CH$_2$-R" | H | acac | 0.33, 0.60 | 508 |

For each of the materials fabricated, R'3=R'5=H. An entry of "tris" for the ancillary ligand X indicates a deviation from Formula 7, in that there was no ancillary ligand X, and three photoactive ligands (m=3, n=0). In compound 28, the R" and R'$_2$ substituents are linked, i.e., the two substituent positions are linked by an ethylene group. PL is the peak photoluminescent wavelength, measured in nm. The Pt compounds also deviate from Formula 7, because Pt may coordinate to only two bidentate ligands, such that the Pt compounds listed in Table 1 have one ancillary and only one photoactive ligand (m=1, n=1), not two photoactive ligands as indicated in Formula 7.

For each compound 1 through 28, a small amount of the compound was dissolved in dichloromethane. Each solution was optically pumped, and the resultant photoluminescent spectra were measured. The resultant peak wavelengths and CIE coordinates are tabulated in Table 1.

A preferred embodiment, compound 1, has the structure of Formula 8:

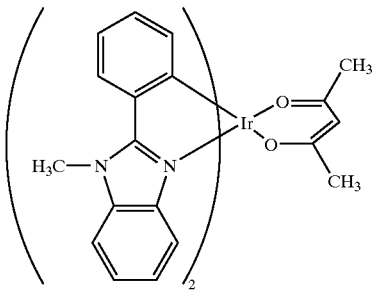

Devices incorporating compounds 1, 3 and 5, as well as Ir(ppy)$_3$, were fabricated and characterized. All samples were fabricated on glass substrates coated with an ITO anode about 130–150 nm thick, obtained from Applied Films Corp. of Longmont, Colo. Thin films were deposited by thermal evaporation at a pressure of <1×10$^{31\ 6}$ Torr. First CuPc was deposited as a hole injection layer on the anode to a thickness of 10 nm at a rate of 0.3 Å/s. Next, NPD was deposited as a hole transport layer to a thickness of 30 nm at a rate of 1.5 Å/s. Next, the emissive layer was deposited by co-evaporation from different sources. Each device had an emissive layer having CBP as a host material, doped with 6% by weight of the compound being characterized. Devices were fabricated having compounds 1, 3 and 5, as well as Ir(Ppy)$_3$, as dopants. The CBP of the emissive layer was deposited at a rate of 1.6 Å/s (with 6% doping) to a thickness of 30 nm. Next, on the emissive layer, BAlq was deposited as a hole blocking layer to a thickness of 10 nm at a rate of 1.0 Å/s. Next, on the hole blocking layer, Alq$_3$ was deposited as an electron transport layer to a thickness of 40 nm at a rate of 1.0 Å/s. Next, on the electron transport layer, lithium fluoride (LiF) was deposited as an electron injecting layer at a thickness of 0.5 nm at a rate of 0.5 Å/s. Lastly, a cathode of aluminum (Al) was deposited on the electron injecting layer at a thickness of 100 nm at a rate of 2 Å/s to complete the organic light emitting device.

Figure 3:
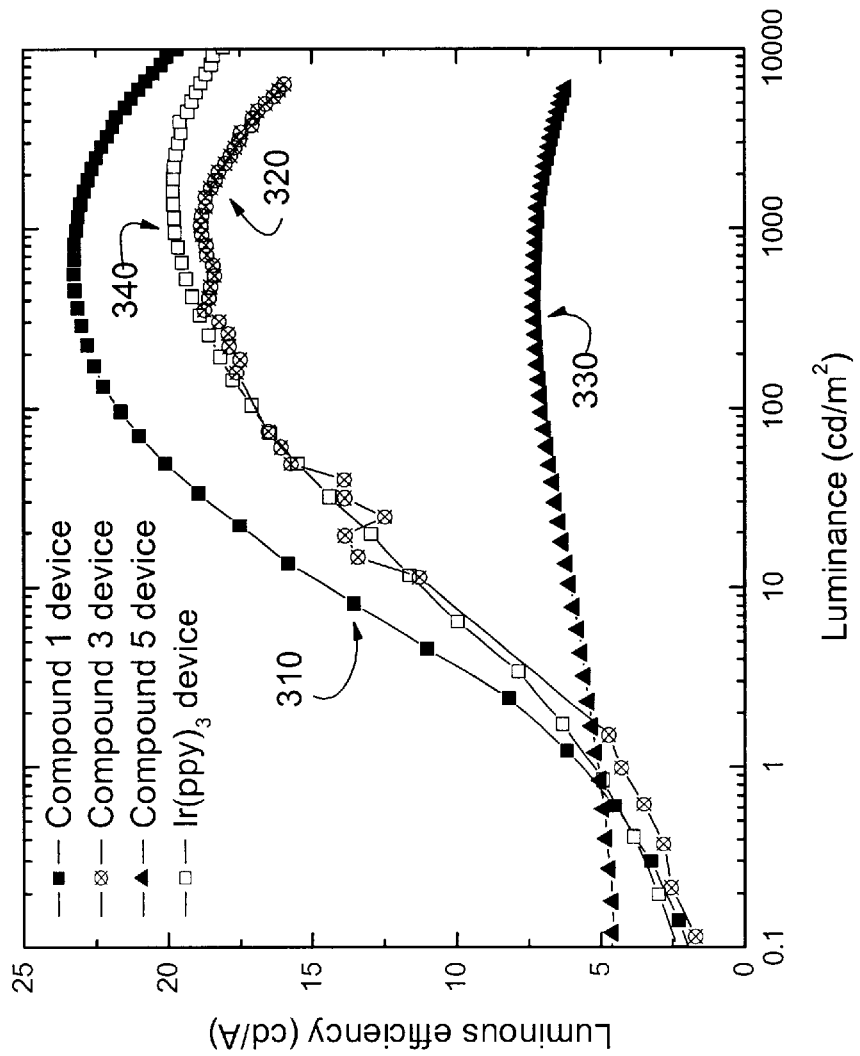
FIG. 3 shows plots of luminous efficiency v. luminance for various devices
Figure 4:
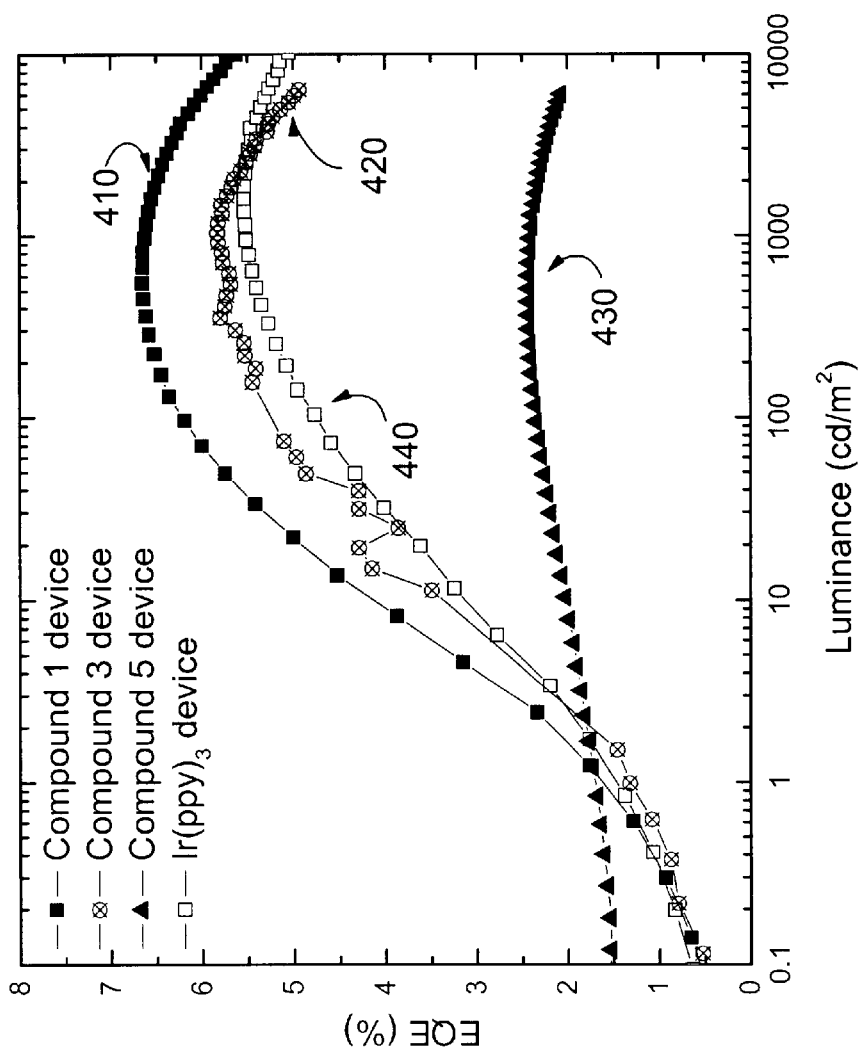
FIG. 4 shows plots of external quantum efficiency v. luminance for various devices.

The devices incorporating compounds 1, 3 and 5, as well as Ir(ppy)$_3$, were characterized at various luminances. FIG. 3 shows plots of luminous efficiency v. luminance. Plots 310, 320, 330 and 340 are for devices doped with compound 1, compound 3, compound 5, and Ir(ppy)$_3$, respectively. FIG. 4 shows plots of external quantum efficiency v. luminance. Plots 410, 420, 430 and 440 are for devices doped with compound 1, compound 3, compound 5, and Ir(Ppy)$_3$, respectively.

FIGS. 3 and 4 show that devices fabricated with compound 1 are more efficient than similar devices fabricated with Ir(ppy)$_3$. While compound 3 appears to be about as efficient as Ir(ppy)$_3$, and compound 5 appears less efficient, the device structure has been optimized for Ir(ppy)$_3$. Using a different structure may improve the efficiency of compounds 1, 3 and 5 compared to Ir(ppy)$_3$. The greater efficiency of compound 1 compared to Ir(ppy)$_3$ in a device structure optimized for Ir(ppy)$_3$ shows that compound 1 represents a significant improvement in efficiency. FIG. 3 further shows that a device using compound 1 is able to achieve a luminous efficiency of at least 20 cd/A, and more preferably 22.5 cd/A, at a luminance of 500 cd/m$^2$, which is superior to the Ir(ppy)$_3$ device tested.

A device was fabricated as described above, except compound 5 was doped into the emissive layer at a concentration of 12% instead of 6%. The device with 12% doping exhibited a slightly better efficiency than the device with compound 5 at 6% doping, indicating that some improvement in efficiency may be obtained by optimizing the device.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. An organic light emitting device, comprising:
   (a) an anode;
   (b) a cathode; and
   (c) an emissive layer disposed between the anode and the cathode, the emissive layer including a material having a ligand having the structure:

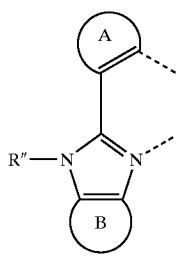

wherein the ligand is attached to a metal having an atomic weight greater than 40, and A is selected from the group consisting of aryl and heteroaryl rings, and B is an aryl ring, and R" is selected from the group consisting of hydrogen and any substituent.

2. The device of claim 1, wherein the emissive layer includes a material having the structure:

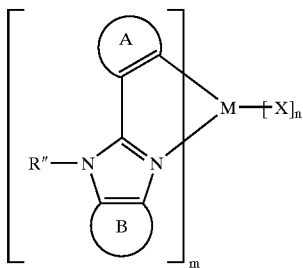

wherein M is a metal having an atomic weight greater than 40, m is at least 1, n is at least zero, R" is hydrogen or any substituent, X is an ancillary ligand, and A is selected from the group consisting of aryl and heteroaryl rings, and B is an aryl ring.

3. The device of claim 2, wherein at least one of A and B includes a substituent.

4. The device of claim 2, wherein M is selected from the group consisting of Ir, Pt, Pd, Rh, Re, Ru, Os, Tl, Pb, Bi, In, Sn, Sb, Te, Au, and Ag.

5. The device of claim 4, wherein m is 2, and wherein n is 1.

6. The device of claim 2, wherein M is Ir.

7. The device of claim 2, wherein M is Pt.

8. The device of claim 2, wherein n is zero.

9. The device of claim 2, wherein the emissive material is incorporated into a polymer.

10. The device of claim 2, wherein the emissive material is incorporated into a dendrimer.

11. The device of claim 2, wherein the emissive layer further comprises a host material.

12. The device of claim 11, wherein the emissive material is a dopant in the host material.

13. The device of claim 2, wherein the emissive material consists essentially of a neat film of the emissive material.

14. The device of claim 2, wherein the emissive layer includes a material having the structure:

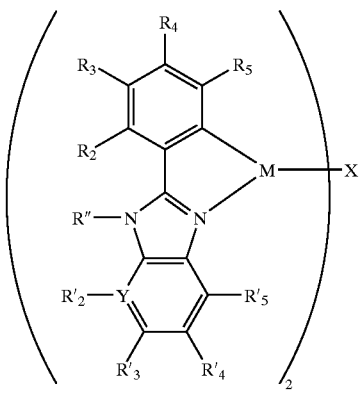

wherein:
   Y is C; and
   R2, R3, R4, R5, R'2, R'3, R'4, and R'5 are each independently selected from the group consisting of hydrogen and any substituent.

15. The device of claim 14, wherein R2, R3, R4, R5, R'2, R'3, R'4 and R'5 are each a hydrogen atom, R" is —$CH_3$, and X is acac.

16. The device of claim 14, wherein at least one of the groups R2, R3, R4, R5, R'2, R'3, R'4 and R'5 is linked to another of the groups R2, R3, R4, R5, R'2, R'3, R'4 and R'5 to form a ring.

17. The device of claim 2, wherein:
   the emissive layer includes a material having the structure:

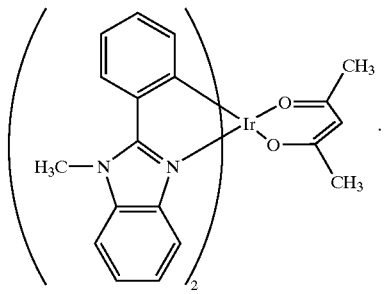

18. The device of claim 2, wherein the device has a luminous efficiency of at least 22.5 cd/A, at a luminance of 500 cd/m$^2$.

19. An emissive material having a ligand having the structure:

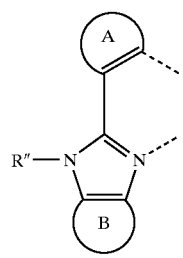

wherein the ligand is attached to a metal having an atomic weight greater than 40, and A is selected from the group consisting of aryl and heteroaryl rings, and B is an aryl ring, and R" is selected from the group consisting of hydrogen and any substituent.

20. The emissive material of claim 19, wherein the material has the structure:

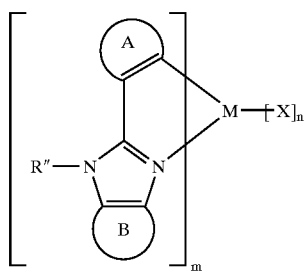

wherein M is a metal having an atomic weight greater than 40, m is at least 1, n is at least zero, R″ is hydrogen or any substituent, X is an ancillary ligand, and A is selected from the group consisting of aryl and heteroaryl rings, and B is an aryl ring.

21. The emissive material of claim 20, wherein at least one of A and B includes a substituent.

22. The emissive material of claim 20, wherein M is selected from the group consisting of Ir, Pt, Pd, Rh, Re, Ru, Os, Tl, Pb, Bi, In, Sn, Sb, Te, Au, and Ag.

23. The emissive material of claim 22, wherein m is 2, and wherein n is 1.

24. The emissive material of claim 20, wherein M is Ir.

25. The emissive material of claim 20, wherein M is Pt.

26. The emissive material of claim 20, wherein n is zero.

27. The emissive material of claim 20, wherein the emissive material is incorporated into a polymer.

28. The emissive material of claim 20, wherein the emissive material is incorporated into a dendrimer.

29. The emissive material of claim 20, wherein the emissive layer further comprises a host material.

30. The emissive material of claim 29, wherein the emissive material is a dopant in the host material.

31. The emissive material of claim 20, wherein the emissive material consists essentially of a neat film of the emissive material.

32. The emissive material of claim 20, wherein the emissive layer includes a material having the structure:

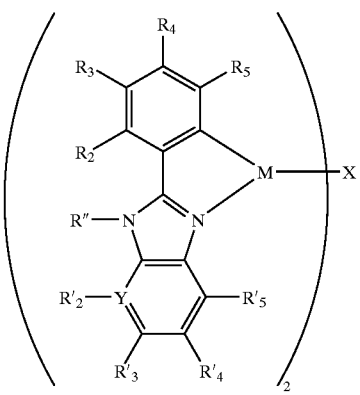

wherein:
M is Ir;
Y is C; and
R2, R3, R4, R5, R'2, R'3, R'4, and R'5 are each independently selected from the group consisting of hydrogen and any substituent.

33. The emissive material of claim 32, wherein R2, R3, R4, R5, R'2, R'3, R'4 and R'5 are each a hydrogen atom, R″ is —CH$_3$, and X is acac.

34. The emissive material of claim 32, wherein at least one of the groups R2, R3, R4, R5, R'2, R'3, R'4 and R'5 is linked to another of the groups R2, R3, R4, R5, R'2, R'3, R'4 and R'5 to form a ring.

35. The emissive material of claim 20, wherein the emissive material has the structure:

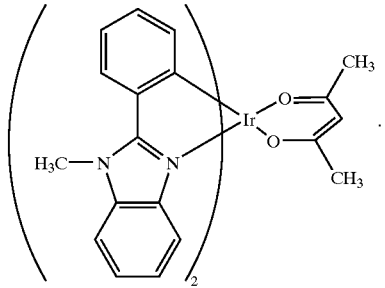

* * * * *

UNITED STATES PATENT AND TRADEMARK OFFICE
CERTIFICATE OF CORRECTION

PATENT NO. : 6,687,266 B1
DATED : February 3, 2004
INVENTOR(S) : Bin Ma et al.

It is certified that error appears in the above-identified patent and that said Letters Patent is hereby corrected as shown below:

Column 17,
Line 56, change "$<1 \times 10^{31\ 6}$ Torr." to -- $<1 \times 10^{-6}$ Torr. --;
Line 66, change "Ir(Ppy)$_3$," to -- Ir(ppy)$_3$, --; and Column 20,
Line 18, after "wherein" insert a new paragraph and -- M = Ir; --.

Signed and Sealed this

Twenty-fourth Day of August, 2004

JON W. DUDAS
*Director of the United States Patent and Trademark Office*

UNITED STATES PATENT AND TRADEMARK OFFICE
CERTIFICATE OF CORRECTION

PATENT NO.   : 6,687,266 B1
DATED        : February 3, 2004
INVENTOR(S)  : Bin Ma et al.

It is certified that error appears in the above-identified patent and that said Letters Patent is hereby corrected as shown below:

Column 19,
Line 42, change "than 40, in is at least 1" to -- than 40, m is at least 1 --.

Signed and Sealed this

Tenth Day of May, 2005

JON W. DUDAS
*Director of the United States Patent and Trademark Office*